(12) United States Patent
Abraham et al.

(10) Patent No.: US 10,727,192 B2
(45) Date of Patent: Jul. 28, 2020

(54) MULTIPLE SIZED BUMP BONDS

(71) Applicant: INTERNATIONAL BUSINESS MACHINES CORPORATION, Armonk, NY (US)

(72) Inventors: David W. Abraham, Croton, NY (US); John M. Cotte, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 15/813,760

(22) Filed: Nov. 15, 2017

(65) Prior Publication Data
US 2020/0035585 A1 Jan. 30, 2020

Related U.S. Application Data

(63) Continuation of application No. 15/498,613, filed on Apr. 27, 2017.

(51) Int. Cl.
*H01L 21/44* (2006.01)
*H01L 23/00* (2006.01)
(Continued)

(52) U.S. Cl.
CPC ............ *H01L 24/17* (2013.01); *H01L 23/488* (2013.01); *H01L 23/50* (2013.01); *H01L 24/09* (2013.01); *H01L 24/11* (2013.01); *H01L 24/14* (2013.01); *H01L 24/05* (2013.01); *H01L 24/13* (2013.01); *H01L 2224/0345* (2013.01); *H01L 2224/03462* (2013.01); *H01L 2224/0401* (2013.01); *H01L 2224/05022* (2013.01); *H01L 2224/05124* (2013.01); *H01L 2224/05147* (2013.01); *H01L 2224/05572* (2013.01);
(Continued)

(58) Field of Classification Search
CPC . H01L 21/4853; H01L 21/4825; H01L 24/04; H01L 24/09; H01L 24/10; H01L 24/11; H01L 24/12; H01L 24/14; H01L 24/15; H01L 24/17
See application file for complete search history.

(56) References Cited

U.S. PATENT DOCUMENTS 3,871,015 A 3/1975 Lin et al.
6,541,366 B1 4/2003 Chin et al.
(Continued)

OTHER PUBLICATIONS

Notification of Transmittal of the International Search Report and the Written Opinion of the International Searching Authority, or the Declaration, issued in International Application No. PCT/EP2017081306, dated Mar. 16, 2018; 15 pages.
(Continued)

*Primary Examiner* — Cuong Q Nguyen
(74) *Attorney, Agent, or Firm* — Erik K. Johnson

(57) ABSTRACT

A semiconductor structure and methods for the creation of solder bumps configured to carry a signal and solder bumps configured for ground planes and/or mechanical connections as well as methods for increasing reliability of a chip package generally include formation of multiple sized bump bonds on under bump metallization patterns and/or pads of the same dimension. The signal carrying solder bumps are larger in terms of diameter and bump height than solder bumps configured for ground plane and/or mechanical connections.

14 Claims, 2 Drawing Sheets

(51) Int. Cl.
*H01L 23/50* (2006.01)
*H01L 23/488* (2006.01)

(52) U.S. Cl.
CPC .............. *H01L 2224/05666* (2013.01); *H01L 2224/061* (2013.01); *H01L 2224/1141* (2013.01); *H01L 2224/1145* (2013.01); *H01L 2224/1147* (2013.01); *H01L 2224/11452* (2013.01); *H01L 2224/11462* (2013.01); *H01L 2224/11472* (2013.01); *H01L 2224/11849* (2013.01); *H01L 2224/11901* (2013.01); *H01L 2224/13006* (2013.01); *H01L 2224/13007* (2013.01); *H01L 2224/13022* (2013.01); *H01L 2224/13111* (2013.01); *H01L 2224/13116* (2013.01); *H01L 2224/1403* (2013.01); *H01L 2224/14104* (2013.01); *H01L 2224/14517* (2013.01)

(56) References Cited

U.S. PATENT DOCUMENTS

| | | | |
|---|---|---|---|
| 6,611,050 B1 * | 8/2003 | Ference | H01L 24/11 257/678 |
| 6,624,004 B2 | 9/2003 | Lee | |
| 6,756,294 B1 | 6/2004 | Chen et al. | |
| 6,793,500 B1 | 9/2004 | Budell et al. | |
| 7,084,500 B2 | 8/2006 | Swnson et al. | |
| 7,312,529 B2 | 12/2007 | Clevenger et al. | |
| 7,507,655 B2 | 3/2009 | Sakaguchi et al. | |
| 7,569,471 B2 | 8/2009 | Pang et al. | |
| 8,546,954 B2 | 10/2013 | Kwon et al. | |
| 8,703,600 B2 | 4/2014 | Migita et al. | |
| 8,704,371 B2 | 4/2014 | Razak | |
| 8,742,578 B2 | 6/2014 | Arvin et al. | |
| 8,860,218 B2 | 10/2014 | Razak | |
| 8,952,532 B2 | 2/2015 | Zheng et al. | |
| 9,207,275 B2 | 12/2015 | Bartley et al. | |
| 9,343,419 B2 | 5/2016 | Yu et al. | |
| 10,109,608 B2 | 10/2018 | Lin et al. | |
| 2005/0104222 A1 | 5/2005 | Jeong | |
| 2007/0069346 A1 * | 3/2007 | Lin | H01L 24/11 257/673 |
| 2008/0160752 A1 | 7/2008 | Clevenger et al. | |
| 2008/0286886 A1 * | 11/2008 | Carey | H01L 22/14 438/15 |
| 2012/0305633 A1 | 12/2012 | Feger et al. | |
| 2014/0021607 A1 | 1/2014 | Arvin et al. | |
| 2015/0097286 A1 | 4/2015 | Suen et al. | |
| 2016/0322323 A1 * | 11/2016 | Lai | H01L 24/14 |

OTHER PUBLICATIONS

David W. Abraham, et al., Pending U.S. Appl. No. 15/498,613, entitled "Multiple Sized Bump Bonds," filed with the U.S. Patent and Trademark Office, filed Apr. 27, 2017.

List of IBM Patents or Patent Applications Treated As Related; (Appendix P), Date Filed Nov. 15, 2017; 2 pages.

* cited by examiner

MULTIPLE SIZED BUMP BONDS

DOMESTIC PRIORITY

This application is a CONTINUATION of U.S. Non-Provisional application Ser. No. 15/498,613, filed on Apr. 27, 2017, which is incorporated herein by reference in its entirety.

STATEMENT REGARDING FEDERALLY SPONSORED RESEARCH OR DEVELOPMENT

This invention was made with Government support under Contract No. H98230-13-D-0173 by the National Security Agency. The Government has certain rights to this invention.

BACKGROUND

The present invention generally relates to fabrication methods and the resulting structures for semiconductor devices. More specifically, the present invention relates to the structure and formation of different sized solder bumps for signal carrying and solder bumps for ground plane and/or mechanical connections.

Generally, semiconductor devices utilize metal die pads for receiving and supplying signals to and from other circuitry. The die pad is usually in a rectangular shape, wherein some of the metal layers are utilized for carrying signals between the die pads and other circuitry of the IC chip. The other die pads are used for mechanical connections and/or ground connections. One method of die assembly utilizes a solder bumped die that are flip chip assembled onto a workpiece. Flip chip interconnections provide short electrical connecting paths as compared to wire bonds, and therefore better electrical performance including speed. Conventional semiconductor dies for flip chip applications typically have a single bump size including a single bump height and a single bump diameter that that are formed over die pads of a single fixed size. Other semiconductor dies vary the bump size but alter the height of the receiving pad to compensate for bump size variation.

SUMMARY

The present invention is generally directed to semiconductor device structures and methods for forming the semiconductor structures. In one or more embodiments, semiconductor device includes a plurality of under bump metallization (UBM) layers overlying a pad, wherein each one of the UBMs have the same dimension. A first solder bump is disposed on selected ones of the UBM layers. A second solder bump is disposed on the other ones of the UBM layers, wherein the first solder bumps have a first diameter (d1) and the second solder bumps have a second diameter (d2), wherein d1 is greater than d2, and wherein the first solder bumps are configured to carry signals between chips and the second solder bumps are configured for mechanical connection and/or ground connections.

In one or more other embodiments, a semiconductor device includes a plurality of under bump metallization (UBM) layers overlying a pad, wherein each one of the UBMs have the same dimension. A first solder bump is disposed on selected ones of the UBM layers. A second solder bump is disposed on the other ones of the UBM layers, wherein the first solder bumps have a bump height (bh1) and the second solder bumps have a bump height (bh2), wherein bh1 is greater than bh2, and wherein the first solder bumps are configured to carry signals between chips and the second solder bumps are configured for mechanical connection and/or ground connections.

In still one or more other embodiments, a semiconductor device includes one or more solder bumps configured for carrying a signal; and one or more solder bumps configured for ground plane or mechanical connection, wherein the one or more solder bumps configured for carrying the signal have a greater bump height than the one or more solder bumps configured for ground plane or mechanical connection.

In one or more embodiments, a method for the creation of solder bumps configured to carry a signal and solder bumps configured for ground planes and/or mechanical connections includes providing a semiconductor substrate, at least two similarly dimensioned contact pads having been provided over the substrate, a passivation layer deposited over said substrate, the passivation layer having at least two openings that aligns with the least two similarly dimensioned contact pads, and an under bump metallization layer over each one of the least two similarly dimensioned contact pads. A photoresist layer is deposited onto the substrate and contact holes aligned with at least a portion of the at least two contact pads are formed, wherein the contact holes for the creation of solder bumps configured to carry the signal have a greater diameter than the contact holes for the creation of solder bumps configured for ground planes and/or mechanical connections. The contact holes are filled with a solder metal to form solder columns. The photoresist removed, and the solder columns reflowed to form the solder bumps configured to carry the signal and the solder bumps configured for ground planes and/or mechanical connections, wherein the solder bumps configured to carry the signal have a greater bump height than the solder bumps configured for ground planes and/or mechanical connections.

In one or more embodiments, a method of increasing reliability of a chip package includes forming a plurality of under bump metallization (UBM) patterns on a surface of a substrate, wherein each one of the UBM patterns is of the same dimension. A photoresist layer overlying the surface is deposited and contact holes formed in the photoresist layer, wherein the contact holes are aligned to the UBM pattern, wherein a selected portion of the contact holes have a first diameter and the other portion of the contact holes have a second diameter, and wherein the first diameter is greater than the second diameter. The contact holes are filled with a solder metal by an injection molding soldering process to form solder columns. The photoresist removed, and the solder columns reflowed to form solder bumps configured to carry a signal from the solder metal filled contact holes having the first diameter and solder bumps configured for ground planes and/or mechanical connections from the solder metal filled contact holes having the second diameter, wherein the solder bumps configured to carry the signal have a bump height greater than the solder bumps configured for ground planes and/or mechanical connections.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
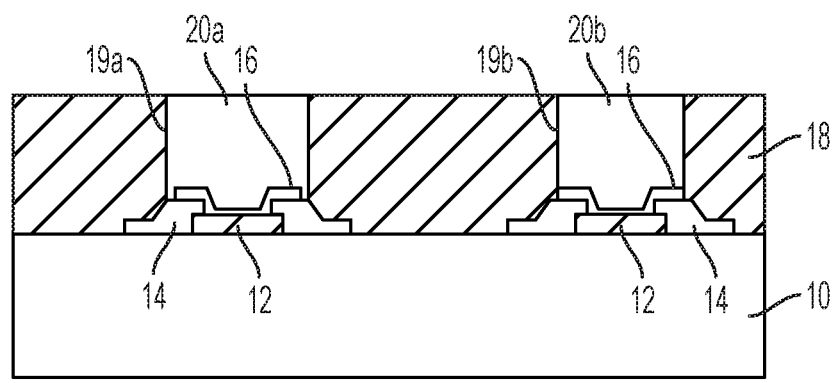
FIG. 1 is a sectional view depicting a semiconductor device after a fabrication operation according to embodiments of the invention.

Exemplary embodiments of the invention will now be discussed in further detail with regard to semiconductor devices and methods of manufacturing the same and, in particular, to structures including different sized solder bump bonds for improved reliability and methods of manufacture. As will be described in greater detail, the methods and resulting structures are fabricated such that the bump bonds configured for carrying signals are larger than the bump bonds configured for mechanical connections and/or for ground connections, wherein the different sized solder bumps are formed on die pads (and under bump metallization layers) of the same dimension.

Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

Some chip bonding technologies utilize a solder bump attached to a contact pad (chip bonding pad) on the chip to make an electrical connection from the chip devices to the package. For example, C4 (Controlled-Collapse Chip Connection) is a means of connecting semiconductor chips to substrates in electronic packages. C4 is a flip-chip technology in which the interconnections are small solder balls (bumps) on the chip surface. Since the solder balls forms an area array, C4 technology can achieve the highest density scheme known in the art for chip interconnections. The flip chip method has the advantage of achieving the highest density of interconnection to the device with the lowest parasitic inductance.

Solder bumps can be formed by, for example, vapor deposition of solder material over layers of under bump metallization (UBM) formed on the chip bonding pad. In another method, the layers of solder material can be deposited by electrodeposition onto a seed layer material deposited over UBM layers formed on the chip bonding pad. In yet another method, solder bumps can be formed by a solder-paste screen printing method using a mask (stencil) to guide the placement of the solder-paste. Typically, after deposition of the solder materials, for example, in layers or as a homogeneous mixture, the solder bump (ball) is formed after removing a photoresist mask defining the solder material location by heating the solder material to a melting point where according to a reflow process a solder ball is formed with the aid of surface tension.

The solder bump bonds are generally used for signal carrying, mechanical connection, and ground plane connections. The various solder bump bonds are not symmetrical within a given packaging scheme with signal carrying bump bonds being much fewer in number than bump bonds configured for ground planes and/or for mechanical connection. The signal carrying bumps can be used for eventual connection to room temperature electronics. Because of this, the impact of a failed ground plane/mechanical connection is less significant than the impact of a failed signal carrying bump bond. Failure of the ground/mechanical connection can be tolerated given the redundancies built into a semiconductor device but signal carrying bump bonds are much more critical and failure can be catastrophic. If rework is also considered, any design that favors integrity of the bump bonds configured for signal carrying, potentially at the cost of a somewhat reduced yield of the bump bonds configured for mechanical/ground connections, is advantageous. The present invention provides semiconductor devices such as flip chips and methods of fabricating the same with different solder bump geometries for signal carrying bump bonds relative to those solder bumps configured for ground plane and/or mechanical connections. As will be described in greater detail below, the signal carrying solder bumps are fabricated to be larger diameter and have a higher height than the ground plane and/or mechanical solder bumps, wherein the different sized bumps can be formed from the same dimensioned under bump metallization layers and die pads.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

The term "under bump metal (UBM) "or" under bump metallization (UBM)" as used herein refers to structures that adhere well both to the underlying pad and to the surrounding circuits passivation layer, hermetically sealing the circuits from the environment. In some cases, a UBM can provide a strong barrier to prevent the diffusion of other bump metals into the circuits. A top layer of a UBM must be readily wettable by the bump metals, for solder reflow. In one or more embodiments, a UBM uses multiple different metal layers, such as an adhesion layer, a diffusion barrier layer, a solderable layer, and an oxidation barrier layer. It is further possible that the UBM layers are compatible metals which in combination have low internal mechanical stresses.

Copper, gold and nickel are among the more popular materials used for fabricating the UBM due to their conductivity at room temperature and their ability to provide structural support to the corresponding solder bumps. However, the present invention is not limited to copper, gold and nickel as other metals can be used as can be desired for different applications. For example, superconducting metals can be used.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that can require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular. Thus, for example, reference to a problem-solving system including "a solder bump" includes a single solder bump, or two or more solder bumps. It should also be noted that the term "or" is generally employed in its sense including "and/or" unless the content clearly dictates otherwise.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Embodiments of the present invention include providing a semiconductor device having a plurality of under bump metallization (UBM) layers on die pads. The plurality of UBM layers and the corresponding die pads are of the same dimensions, wherein the solder bumps are selected to have different sizes depending on whether they are configured for signal carrying or for ground plane and/or mechanical connection. The solder bumps configured for signal carrying connections have a larger diameter and a greater height than the solder bumps utilized for other connections such as for ground planes and mechanical connections. As a result, improved reliability is realized in the semiconductor device because there is greater areal contact provided by the larger solder bump size of the signal carrying solder bumps when bonded to another substrate, e.g., die.

As will be described in greater detail, the solder bumps can be formed using an injection molding soldering process, wherein the amount of injected solder metal into a contact hole formed within a photoresist layer for defining the solder bumps is generally dependent on the area therein. In the present invention, the contact hole dimensions within the photoresist layer utilized to form signal carrying solder bumps are larger than the contact hole dimensions utilized to form other types of solder bumps, e.g., ground planes and/or mechanical connections. In one or more embodiments, the contact hole dimensions to form signal carrying solder bumps is greater than a perimeter defined by the underlying UBM and die pad whereas the contact hole dimensions utilized to form other types of solder bumps is less than the perimeter defined by the underlying UBM and die pad. Subsequent reflow of solder after photoresist removal will result in different diameter and different height solder bumps based on the area provided by photoresist contact hole even though the underlying UBM and die pad are of the same dimensions for all types of solder bumps.

Figure 2:
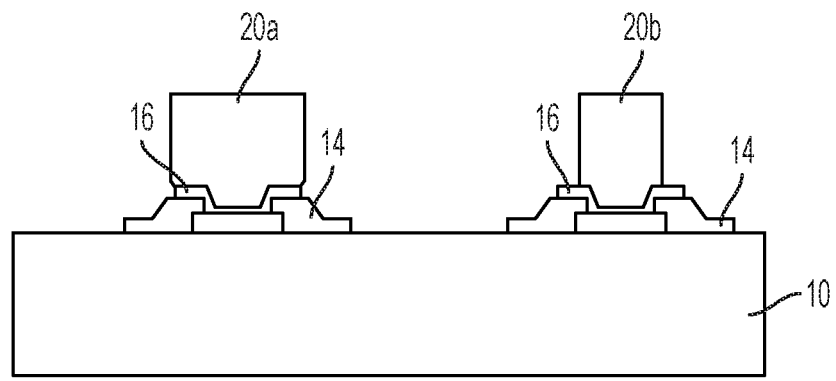
FIG. 2 is a sectional view depicting a semiconductor device after a fabrication operation according to embodiments of the invention.
Figure 3:
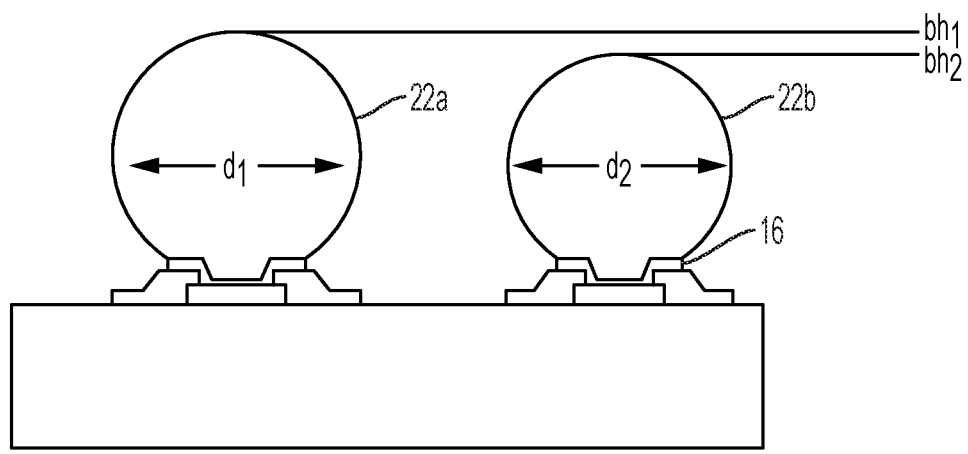
FIG. 3 is a sectional view depicting a semiconductor device after a fabrication operation according to embodiments of the invention.

FIGS. 1-3 provide cross sectional views of an exemplary chip bonding pad and associated UBM layers and solder bumps for chip bonding in flip chip technology, wherein selected ones of the solder bumps are configured for signal carrying and the other ones are configured for other connections such as for ground plane and mechanical connections.

Referring now to FIG. 1, the process of creating the solder bumps is subsequent to formation and patterning of under bump metallization layers 16 on chip bonding pads 12 formed on a substrate 10. The substrate 10 can be an integrated circuit having a plurality of traces and electrodes or vias. Any number of individual traces and other conductive features can be formed on a top surface. Such features can be localized or can extend the full length of the top surface. Discrete components such as multi-pin electrical connectors, integrated circuits, resistors, capacitors, stiffeners, etc. can also be incorporated into the top surface or integrated circuit as can be desired for the various applications.

The chip bonding pads 12, for example copper (Cu) or aluminum (Al), can be formed by vapor deposition on the surface of the substrate 10. Typically, after the chip bonding pad 12 is formed, a passivation layer 14 of, for example, silicon dioxide ($SiO_2$) polyimide, benzocyclobutene (BCB), silicon nitride, or the like, is formed over the substrate surface excluding a portion overlying the chip bonding pad 12. A plurality of under bump metallization (UBM) layers 16, e.g., of from about 500 Angstroms to about 5000 Angstroms are then formed over the chip bonding pad 12 and patterned. The UBM layer 16 can be, for example, a layer of titanium (Ti). The UBM layers are formed over the chip bonding pad 12 to allow for better bonding and wetting of the solder material and for protection of the chip bonding pad. As shown, each of the UBM layers as well as the bonding pads have the same circumferential dimensions.

In the present invention, a photoresist layer 18 is deposited onto the substrate and photolithographically patterned and developed to form contact holes 19a, 19b above the contact pad 12 to expose at least a portion of the UBM layer 16. The photolithography process can include, for example, introducing electromagnetic radiation such as ultraviolet light through an overlay mask to cure a photoresist material (not shown). Depending upon whether the resist is positive or negative, uncured portions of the resist are removed to form the first resist pattern including openings to expose portions of the conductive metal layer, which can then be etched to form openings within the conductive metal layer, thereby exposing portions of the underlying layer. The material defining photoresist can be any appropriate type of photoresist materials, which can partly depend upon the device patterns to be formed and the exposure method used. For example, material of photo-resist layer can include a single exposure resist suitable for, for example, argon fluoride (ArF); a double exposure resist suitable for, for example, thermal cure system; and/or an extreme ultraviolet (EUV) resist suitable for, for example, an optical process. The thin layer of metal defining the UBM layer can be deposited by evaporation, sputtering or by electroplating.

For the signal carrying solder bumps, contact holes 19a are patterned to provide a larger diameter than the contact holes 19b patterned for solder bumps configured for mechanical connections and/or for ground planes as shown. A column of solder material 20 can either be deposited in layers, for example, a layer of lead (Pb) followed by a layer of tin (Sn), the solder material layers later being formed into a homogeneous solder during reflow, or can be deposited as a homogeneous solder material by for example vapor deposition or by electroplating onto a seed layer or by an injection molding soldering (IMS) process.

By way of example, the IMS process can be used to fill the contact holes 19 with molten solder or solder alloys of any composition. It is accomplished by using an IMS head where the solder is loaded and melted first and then placed tightly against the photoresist surface and glided across the surface. A vacuum channel is provided ahead of the solder slot such that the contact holes are under vacuum. Molten solder then runs quickly into the openings that are under vacuum and thereby filling the contact holes 19 with molten solder. Because of the difference in diameters of the contact holes, the volume of solder placed on the UBM pad during the IMS process will vary according to the area of the contact hole.

Referring now to FIG. 2, after the substrate is cooled, the photoresist layer 18 can be removed leaving the as-deposited solder. The photoresist layer can be selectively removed by a wet etching or dry etching process, e.g., an ashing process. As shown, solder column 20a has a larger diameter than the solder column 20b. Both solder columns have the same height at this stage.

In FIG. 3, the solder columns 20a, 20b are then heated to reflow to form a solder bumps 22a, 22b having a spherical or hemispherical like shape over the UBM layer 16, wherein after reflow the solder bumps 22a, 22b are of different heights and diameters. The bump heights for the different solder bumps are generally dependent on the area defined by the contact holes, which in part is dependent on the size of the underlying pad and generally ranges from about 10 to 300 microns for most applications, although greater or smaller heights can be used. The signal carrying solder bumps 22a have a greater diameter ($d_1$) and a bump height ($bh_1$) than the diameter ($d_2$) and bump height ($bh_2$) for the ground plane and/or mechanical connection solder bumps 22b. Any suitable process that heats the solder causing it to melt, and then allows the material to subsequently cool and harden can be used. Examples include but are not limited to a wave solder machine, an infrared heater, a forced hot air conduction system, an oven, a soldering iron, and the like.

In one or more embodiments, the diameter (d1) of the first solder bump is up to 20 percent larger than the diameter (d2) of the second solder bumps. In other embodiments, the diameter (d1) of the first solder bump is up to 10 percent larger than the diameter (d2) of the second solder bumps; and in still other embodiments, the diameter (d1) of the first solder bump is up to 5 percent larger than the diameter (d2) of the second solder bumps.

In one or more embodiments, a differential between bump height (bh1) of the first solder bumps and the bump height (bh2) of the second solder bumps, after reflow, is greater than 20 percent to less than 5 percent. In other embodiments the differential can be determined by measuring the distribution in sizes of a population of bumps which are intended to be identical in size, and choosing the signal bumps to be one to two standard deviations larger in diameter than the rest of the population.

Most solder metals are alloys, or combinations of pure elements or materials. Alloys have very different melting characteristics compared to their pure metal forms. Most alloys do not have a single melting temperature or melting point; instead they have a melting range. The upper and lower limits of this range are called the liquidus and solidus temperatures, respectively. The solder begins to melt at its solidus temperature and continues to melt until it reaches the liquidus temperature, where it is completely molten. The difference between the solidus and liquidus temperatures is referred to as the gap. Some solder alloys have a large gap, whereas others have a small or virtually non-existent gap. With a large gap, the application of solder bumps directly to the IMS column is feasible because the amount of reflow is easily controlled. If a solder alloy with a small or non-existent gap is used, controlling the amount of reflow can be difficult. The present invention can accomplish the desired result with a wide variety of solder alloys.

Advantageously, the larger bump size of the signal carrying solder bumps improves reliability because of the larger areal contact provided by the increased size. The improved reliability can be tuned by adjusting the total force applied during the bonding process to that required for the smaller solder bumps for ground plane and/or mechanical connection. The larger bumps will experience a larger force and hence a larger deformation leading to a larger are of contact and machining it more likely than the large bump connection is made.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for chip fabrication, the method comprising:
   depositing a photoresist layer in contact with portions of a first substrate and forming a first contact hole aligned with at least a portion of a first contact pad and a second contact hole aligned with at least a portion of the second contact pad, wherein the first contact hole has a greater diameter than the second contact holes, wherein the first contact pad and the second contact pad are located on the first substrate, wherein the first contact pad and the second contact pad have substantially similar widths, and wherein an under bump metallization layer is located on the first contact pad and the second contact pad;
   filling the first contact hole and the second contact hole with a solder metal to form solder columns;
   removing the photoresist;
   reflowing the solder columns to form a first solder bump on the first contact pad and a second solder bump on the second contact pad, wherein the first solder bump has a greater height than the second solder bump; and
   joining the first substrate to a second substrate using the first solder bump and the second solder bump, wherein the first solder bump forms an electrical connection between two signal dependent devices, and wherein the second solder bump does not form an electrical connection between two signal dependent devices.

2. The method of claim 1, wherein the first contact pad comprises a material selected from a group consisting of: aluminum, aluminum alloy, and copper.

3. The method of claim 1, wherein removing the photoresist comprises a dry etching process.

4. The method of claim 1, wherein filling the contact holes with the solder metal comprises an injection molding solder process.

5. The method of claim 1, wherein the solder columns are formed of multiple layers.

6. The method of claim 1, wherein the solder columns are of the same height prior to reflow.

7. The method of claim 1, wherein the solder bumps configured to carry the signal have a greater diameter than the solder bumps configured for ground planes and/or mechanical connections.

8. A method of chip fabrication, the method comprising:
   forming a plurality of under bump metallization (UBM) patterns on a surface of a first substrate, wherein each one of the UBM patterns is of the same dimension;
   depositing a photoresist layer in contact with portions of the surface of the first substrate;
   forming contact holes in the photoresist layer, wherein the contact holes are aligned to the UBM pattern, and wherein a selected portion of the contact holes have a first diameter and the other portion of the contact holes have a second diameter, wherein the first diameter is greater than the second diameter;
   filling the contact holes with a solder metal by an injection molding soldering process to form solder columns;
   removing the photoresist; and
   reflowing the solder columns to form a first solder bump on the first contact pad and a second solder bump on the second contact pad, wherein the first solder bump has a greater height than the second solder bump; and
   joining the first substrate to a second substrate using the first solder bump and the second solder bump, wherein the first solder bump forms an electrical connection between two signal dependent devices, and wherein the second solder bump does not form an electrical connection between two signal dependent devices.

9. The method of claim 8, wherein the UBM material comprises titanium.

10. The method of claim 8, wherein removing the photoresist comprises a dry etching process.

11. The method of claim 8, wherein the solder columns are formed of multiple layers.

12. The method of claim 8, wherein the solder columns are of the same height prior to reflow.

13. The method of claim 8, wherein the plurality of UBM patterns are formed of multiple layers.

14. The method of claim 8, wherein the first solder bump has a greater diameter than the second solder bump.

* * * * *